United States Patent [19]

Jordan et al.

[11] Patent Number: 4,847,449
[45] Date of Patent: Jul. 11, 1989

[54] ALIGNMENT APPARATUS FOR USE IN MOUNTING ELECTRONIC COMPONENTS AND HEAT SINKS ON CIRCUIT BOARDS

[75] Inventors: William D. Jordan, Dallas; Donald L. Clemens, The Colony, both of Tex.

[73] Assignee: Thermalloy Incorporated, Dallas, Tex.

[21] Appl. No.: 207,645

[22] Filed: Jun. 16, 1988

Related U.S. Application Data

[63] Continuation of Ser. No. 28,222, Mar. 20, 1987, abandoned, which is a continuation of Ser. No. 883,601, Jul. 9, 1986, abandoned, Continuation-in-part of Ser. No. 773,804, Sep. 9, 1985, abandoned.

[51] Int. Cl.$^4$ ............................................. H05K 7/20
[52] U.S. Cl. .......................... 174/138 G; 174/16.3; 361/386; 361/403
[58] Field of Search .............. 174/16 HS, 138 G; 24/336; 165/80.3; 248/500; 357/81, 81 C; 361/381, 386, 388, 389, 400, 403, 417, 418, 419; 439/70, 73, 330, 377, 487, 525, 526, 571, 573

[56] References Cited

U.S. PATENT DOCUMENTS

| | | | |
|---|---|---|---|
| 3,324,226 | 6/1967 | Tems et al. | 174/138 G X |
| 3,475,657 | 10/1969 | Knowles | 361/381 X |
| 4,388,967 | 6/1983 | Breese | 174/16 HS X |
| 4,446,504 | 5/1984 | Jordan et al. | 361/386 |
| 4,589,794 | 5/1986 | Sugiura et al. | 24/336 X |
| 4,709,302 | 11/1987 | Jordan et al. | 361/388 |

FOREIGN PATENT DOCUMENTS

3335377  4/1985  Fed. Rep. of Germany ...... 361/381

Primary Examiner—Laramie E. Askin
Attorney, Agent, or Firm—Kanz, Scherback & Timmons

[57] ABSTRACT

Alignment apparatus for receiving, aligning and retaining the pin connectors of an electronic component package in predetermined relationship is used to maintain proper alignment of the pin connectors with preformed holes or mounting pads on a printed circuit board or the like when the sub-assembly of a heat sink and an electronic component package is mounted on a printed circuit board or the like.

47 Claims, 7 Drawing Sheets

ALIGNMENT APPARATUS FOR USE IN MOUNTING ELECTRIC COMPONENTS AND HEAT SINKS ON CIRCUIT BOARDS

This application is a continuation of application Ser. No. 7/028,222 entitled Alignment Apparatus For Use In Mounting Electronic Components And Heat Sinks On Circuit Boards filed March 20, 1987 which is a continuation of application Ser. No. 06/883,601 entitled Alignment Apparatus For Use In Mounting Electronic Components And Heat Sinks on Circuit Boards filed July 9, 1986, which is a continuation-in-part of application Ser. No. 06/773,804 entitled Alignment Apparatus For Electronic Components filed Sept. 9, 1985, all of which are now abandoned. This invention relates generally to alignment apparatus for use in mounting electronic components on printed circuit boards. More particularly, but not by way of limitation, this invention relates to alignment apparatus useful in mounting heat sinks and electronic components having pin connectors and the like on printed circuit boards and the like.

In the assembly of electronic apparatus it is necessary to position electronic components which have multiple pin connectors on a printed circuit board having preformed locations for receiving the pin connectors. The preformed locations on printed circuit boards may constitute holes in the printed circuit board or areas on the surface of the printed circuit board to which the pin connectors may be soldered such as is shown in U.S. Pat. No. 4,625,260 entitled Fasteners For Surface Mounting Of Printed Circuit Board Components, issued Nov. 25, 1986, which is incorporated herein by reference. Frequently, it is also necessary to locate a heat sink on the electronic component so that intimate contact is maintained therebetween.

It is also sometimes necessary to attach the heat sink to the circuit board. This is accomplished by structures projecting from the heat sink mounted on preformed locations on the circuit board so that the heat sink can be securely attached to the board such as by soldering. More often than not, these structures are separate components from the heat sink and include some releasable arrangement so that the heat sink can be removed when desired. Thus, in order to mount an electronic component and a heat sink, it is necessary that a multiplicity of pins and structures be aligned with the preformed locations in the circuit board.

In the past, sub-assemblies of parts such as heat sinks and transistors were manually assembled and then manually placed with the pins and structures on the appropriate locations in the circuit board. Manifestly, such manual assembly techniques are slow, labor intensive and thus expensive.

Many electronic circuits are currently being assembled by the use of robots and, after the electronic components are placed in the circuit board, mass soldering techniques are utilized so that all the electronic components are soldered to the board simultaneously and virtually instantaneously. Up to now it has remained necessary, because of the alignment problems, to manually assemble the electronic components to their heat sinks and then manually assemble the sub-assembled parts on the circuit boards.

This invention provides alignment apparatus which permits electronic components and heat sink assemblies to be mounted on the circuit board with all the pin connectors aligned for engagement with preformed circuit board locations so that the assembly can be made by robotic techniques. It thus provides alignment apparatus for use in connection with printed circuit boards, heat sinks and electronic components having pin connectors and the like. The apparatus includes an electrically insulating body having a plurality of holes extending through the body for receiving, aligning and retaining the pin connectors in a precise predetermined relationship. In an alternate embodiment, the alignment apparatus may additionally include means for releasably connecting the alignment apparatus to the heat sink. In another alternate embodiment, the alignment apparatus may include solderable attachment means for attaching the alignment apparatus to the circuit board. Further, the alignment apparatus may include means for securing the electronic component in intimate contact with the heat sink to assure effective thermal transfer therebetween.

The foregoing and additional advantages of the invention will become more apparent as the following detailed description is read in conjunction with the accompanying drawing wherein:

FIG. 1 is a top pictorial view of the alignment apparatus of FIG. 9;

Figure 1:
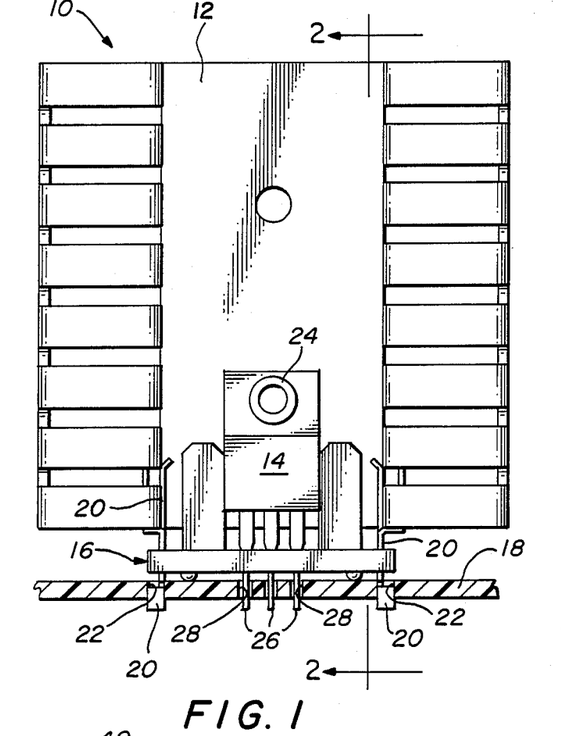
FIG. 1 is a front elevational view of a heat sink, electronic component and alignment apparatus constructed in accordance with the invention and located on a printed circuit board.
Figure 2:
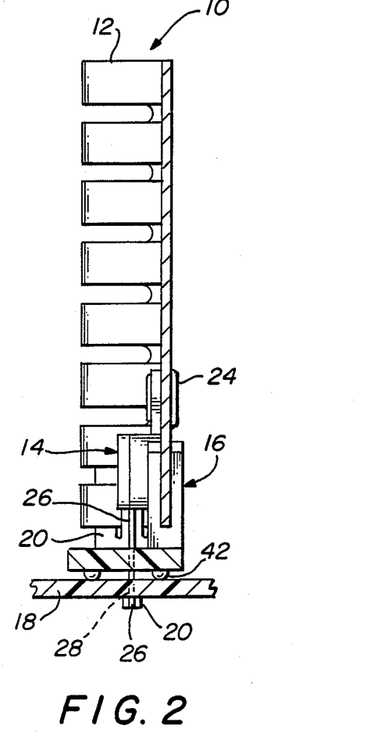
FIG. 2 is a cross-sectional view taken generally along line 2—2 of FIG. 1.

Referring to the drawing and FIGS. 1 and 2 in particular, shown therein and generally designated by the reference character 10 is a sub-assembly consisting of a heat sink 12, an electronic component such as transistor 14, alignment apparatus 16 and a printed circuit board 18.

The heat sink 12 is generally constructed from material of high thermal conductivity such as aluminum or alloys thereof. The heat sink is usually anodized and thus is virtually impossible to solder. To attach the heat sink 12 to the circuit board 18, solderable attachment means such as a pair of lugs 20 (as shown in U.S. Pat. No. 4,388,967) are releasably connected to the heat sink 12 and project through holes 22 preformed in the circuit board 18. The lugs 20 are tinned so that they can be quickly and easily soldered to metal patterns and circuit paths on the board 18.

The transistor 14 (or other electronic component having pin or blade type connectors) is attached to the heat sink 12 by a rivet 24 or other suitable means for holding the transistor 14 in intimate contact with the heat sink to obtain effective heat transfer therebetween. As shown, the transistor 14 includes a plurality of pin connectors 26 which extend through preformed holes 28 in the circuit board 18.

The preformed holes 22 for the lugs 20 and the preformed holes 28 for the pin connectors 26 are automatically punched into the board 18 and are located therein with great accuracy so that the components will be properly located to form the desired circuits. To assure that the lugs 20 and the pin connections 26 are positioned to match the location of the preformed holes 22 and 28, the alignment apparatus 16 is preferably molded from electrically insulating material and necessary holes and slots are located therein so that the relationship of all the holes will be maintained with great accuracy, such as within plus or minus 0.003 inch. Alternatively, and as previously described herein, the lugs could be adapted for soldering to preformed areas on the surface of the printed circuit board.

Figure 3:
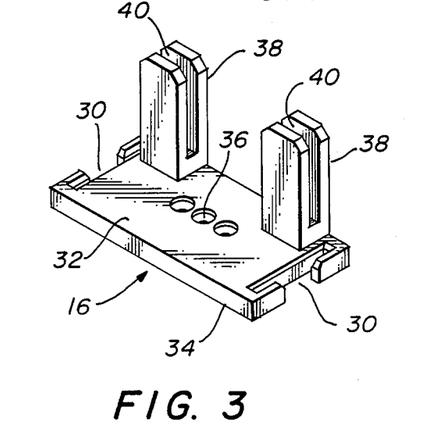
FIG. 3 is a top pictorial view of the alignment apparatus of FIG. 1.
Figure 4:
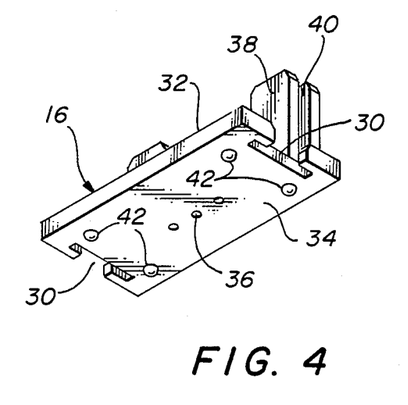
FIG. 4 is a bottom pictorial view of the alignment apparatus of FIG. 1.

The alignment apparatus 16 illustrated in FIGS. 1 and 2 is shown in more detail in the pictorial views of FIGS. 3 and 4. As shown therein the alignment apparatus 16 includes a body constructed as previously described. The body has slots 30 located on each end thereof for receiving the lugs 20 and retaining them in close alignment. The body also includes a top surface 32 and a bottom surface 34 through which a suitable number of pin holes 36 extend. The shape, arrangement and size of the pin holes 36 are determined by the electronic component with which the alignment device 16 is to be used.

Means are provided to releasably connect the body to the heat sink. Projecting upwardly from the top surface 32 is a pair of spaced tabs 38 forming the connection means. Each tab 38 includes a slot 40 for receiving an edge of the heat sink 12. On the bottom surface 34 the alignment apparatus 16 is provided with a plurality of protuberances 42 to space the body of the alignment apparatus 16 a small distance away from the surface of the printed circuit board 18. As in other embodiments of the invention described hereinafter, the protuberances provide access to the underside of the alignment apparatus for cleaning after flow soldering procedures, etc.

Figure 5:
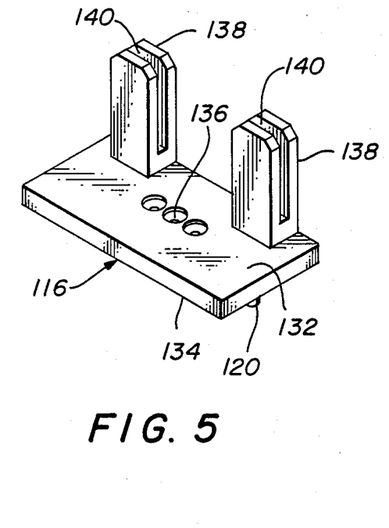
FIG. 5 is a top pictorial view of an alternate embodiment of the alignment apparatus shown in FIG. 3 and FIG. 4 also constructed in accordance with the invention.
Figures 6, 8:
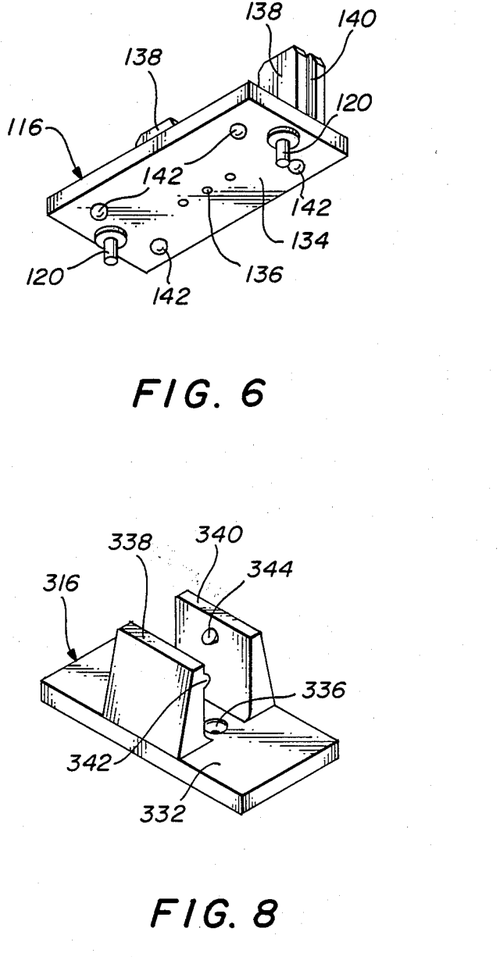
FIG. 6 is a bottom pictorial view of the alignment apparatus of FIG. 5.
FIG. 8 is a top pictorial view of still another embodiment of an alignment apparatus constructed in accordance with the invention.

FIGS. 5 and 6 illustrate a modified form of the alignment apparatus 16 which is designated by the reference character 116. As shown in FIG. 5, the alignment apparatus 116 includes pin holes 136 which extend through n upper surface 132 thereof and through a bottom surface 134. A pair of spaced tabs 138 constitute the connection means, having slots 140 therein projecting upwardly from the upper surface 132. The slots 140 are arranged to receive an edge o the heat sink 12 when assembled therewith as described in connection with the assembly of heat sink 12 in the sub-assembly 10 of FIG. 1.

In the bottom pictorial view of FIG. 6 it can be seen that the alignment apparatus 116 also includes a plurality of protuberances 142 arranged to space the body of the alignment apparatus 116 from the surface of the circuit board 18. In that view it can also be seen that the alignment apparatus includes solderable attachment means in the form of a pair of solderable locator lugs 120 extending from the bottom surface 134. The lugs 120 may be attached to the body of the alignment apparatus 116 by pressing the lugs 120 into the body or by molding the lugs 120 into the body during the molding operation.

The purpose of the lugs 120 is to extend through the locator holes 22 in the circuit board 18 and position the alignment apparatus 116 properly so that the pin holes 136 and pins 26 align properly with the holes 28 in the circuit board 18. Since the lugs 120 are mounted in the insulating body of the alignment apparatus 116 but do not contact the heat sink, the heat sink is electrically isolated from the circuit board.

Figure 7:
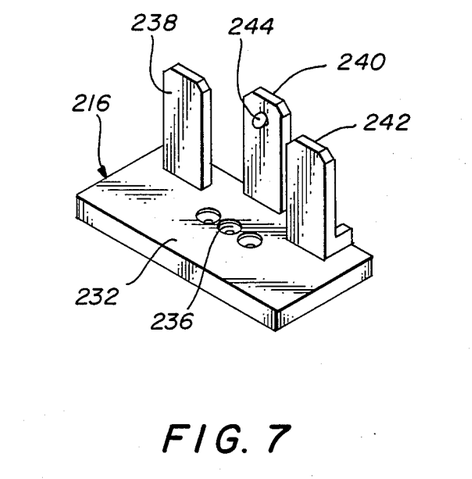
FIG. 7 is a top pictorial view of another embodiment of alignment apparatus constructed in accordance with the invention.

FIG. 7 illustrates another embodiment of alignment apparatus which is designated by the reference character 216. As illustrated therein the alignment apparatus 216 includes pin holes 236 appropriately arranged and configured to receive an electronic component such as transistor 14. Projecting from an upper surface 232 of the alignment apparatus 216 are three spaced tabs 238, 240 and 242 forming the connection means. The tabs are located in an alternating arrangement to receive the heat sink 12 between the tabs 238 and 242 on one side and the tab 240 located on the opposite side thereof.

It will also be noted that tab 240 includes a stud 244 which projects relatively toward tabs 238 and 242. The stud 244 is provided to releasably connect the alignment apparatus 216 to the heat sink by inserting the stud 244 into a hole (not shown) in the heat sink. In addition, similar studs could be formed on tabs 238 and 242, if desired, for engagement with aligned holes (not shown) in the heat sink.

As illustrated, the alignment apparatus 216 does not include the slots 30 of FIG. 3 nor does it include the studs 120 of FIG. 6. It should be understood, however, that the alignment apparatus 216 may be provided with either arrangement desired.

The embodiment of FIG. 8 illustrates an alignment apparatus 316 including appropriately arranged pin holes 336. Projecting from an upper surface 332 of the apparatus 316 are a pair of spaced tabs 338 and 340 forming the connection means. As illustrated, the tabs 338 and 340 are located on opposite edges of the top surface 332 generally straddling the pin holes 336. Tab 338 includes a ledge 342 on the side of tab 338 facing tab 340 which preferably extends the width of the tab 338. The ledge 342 is located to overlap and engage the top edge of an electronic component such as transistor 14 so that the component is secured and retained on the alignment apparatus 316.

The tab 340 is provided with a stud 344 arranged to project through a hole (not shown) in the heat sink and latch the heat sink in position on the alignment apparatus 316. When the transistor 14 is sub-assembled with the heat sink 12 and placed into the space between tabs 338 and 340, the alignment apparatus 316 and sub-assembly are securely attached. As mentioned in connection with the embodiment of FIG. 7, the locator lugs are not shown on apparatus 316. It will be understood that locator lugs of the type illustrated in FIG. 1 and FIG. 2 or of the type illustrated in FIG. 6 may be used as desired.

Figure 9:
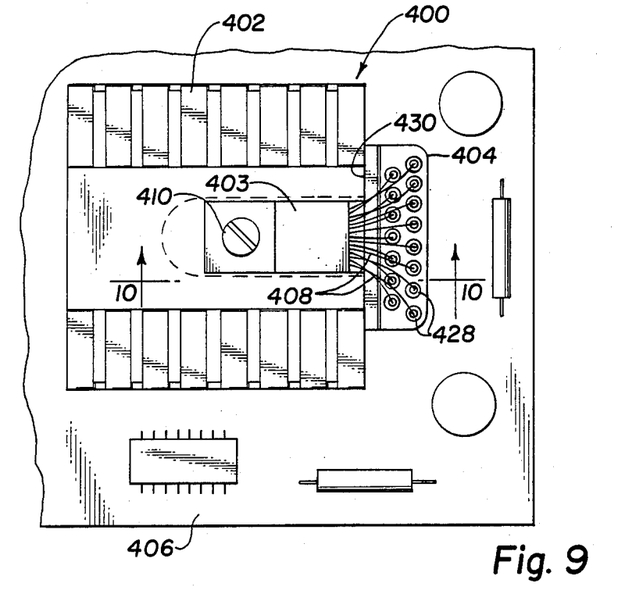
FIG. 9 is a front elevational view of a heat sink, electronic component and still another alternate embodiment of the alignment apparatus of the invention in which the heat sink is supported generally horizontally over a printed circuit board.
Figure 10:
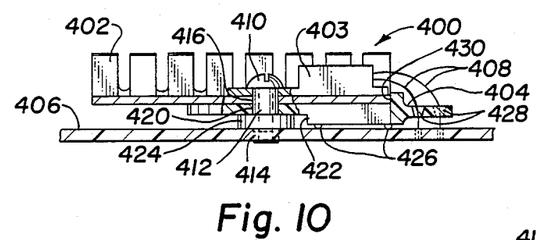
FIG. 10 is a cross-sectional view taken generally along line 10—10 of FIG. 9.

Referring now to FIGS. 9 and 10, the reference character 400 refers to a sub-assembly consisting of a heat sink 402, electronic device package 403 and another alternate embodiment of the alignment apparatus 404 of this invention; and a printed circuit board 406. As shown, electronic component 403 is a modified TO-220 type component package such as the Multi-Watt package component manufactured by SGS Semiconductor Corporation having two parallel rows of fifteen pin connectors or leads 408 extending from either longitudinal edge thereof. The electronic component package is secured to the heat sink by a screw 410 or rivet extending through both the package and the heat sink. The heat sink is supported above the printed circuit board in a horizontal position by a solderable nut 412 having an internally threaded aperture extending therethrough. The solderable nut may be soldered into a preformed hole 414 in the printed circuit board or, alternatively, soldered to the surface of the printed circuit board as previously described. The solderable nut is aligned with a preformed hole 416 in the heat sink and secured such as by the screw 410 or the like. Alternatively, solderable studs or any other suitable means may be used to horizontally mount the heat sink on the printed circuit board.

Figure 11:
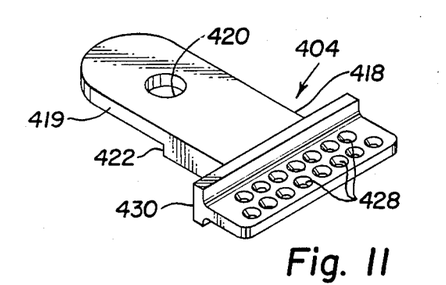
Figure 12:
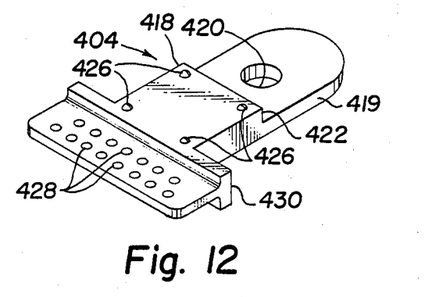
FIG. 12 is a bottom pictorial view of the alignment apparatus of FIG. 11.

Alignment apparatus 404 is shown in greater detail in the pictorial views of FIGS. 11 and 12. The alignment apparatus includes a body 418 constructed of electrically insulating material as previously described but omitting the solderable attachment means and connection means shown in FIGS. 1-8. The body includes a longitudinal section 419 having hole 420 for alignment with solderable nut 412 and hole 416 in the heat sink. If desired, more than one solderable nut may be employed with a like number of aligned holes formed in the body of the alignment apparatus. The solderable nut may, of course, be molded into the body 418 in the position of hole 420 as shown in FIG. 10. Shoulder 422 is formed in the body to accommodate stand-off portion 424 of the solderable nut. The body may also include a plurality of protuberances 426 on its underside for spacing the body from the surface of the printed circuit board. The body includes a plurality of preformed pin holes 428 extending through the body in two parallel rows for receiving the pin connectors of the electronic component, retaining them in a predetermined relationship and aligning them with the printed circuit board. Transverse shoulder 430 is formed and adapted to register against an edge of the heat sink to position the body of the alignment apparatus with respect thereto. Of course, the alignment apparatus of this embodiment could be modified to be employed with a heat sink mounted on the printed circuit board in an upright manner or at various angular configurations.

Figure 13:
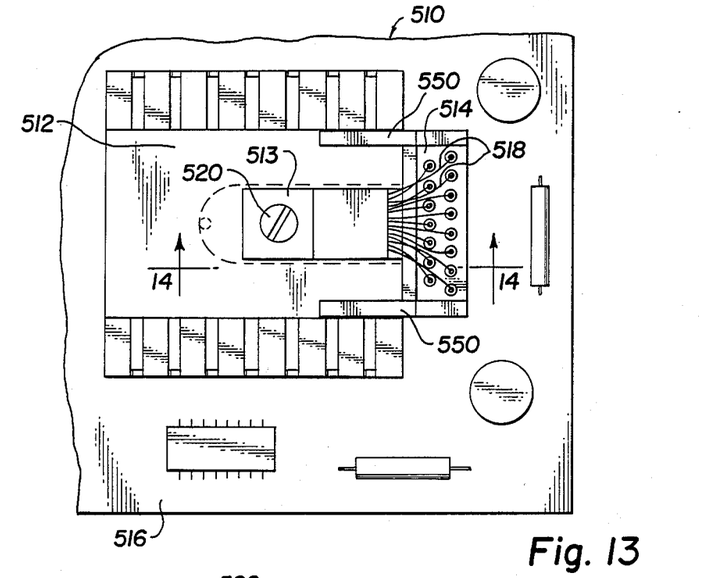
FIG. 13 a front elevational view of a heat sink, electronic component and alignment apparatus constructed in accordance with yet another embodiment of the invention and mounted on a printed circuit board.
Figure 14:
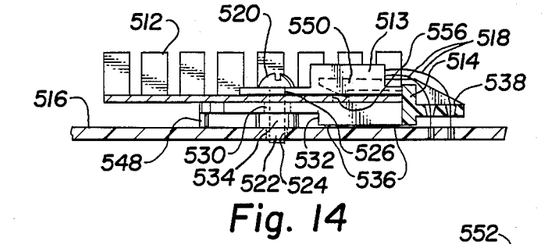
FIG. 14 is a cross-sectional view taken generally along line 14-14 of FIG. 13.

Referring now to FIGS. 13 and 14, the reference character 510 refers to a sub-assembly consisting of a heat sink 512, electronic component 513 and yet another alternate embodiment of the alignment apparatus 514 of this invention; and a printed circuit board 516. Electronic component 513 is similar to component 403 in FIGS. 9 and 10 and includes two parallel rows having fifteen pin connectors or leads 518 extending from either longitudinal edge thereof. The electronic component package is secured to the heat sink by a screw 520, rivet or the like extending through both the package and the heat sink. As in the embodiment shown in FIGS. 9 and 10, the heat sink is supported above the printed circuit board in a horizontal position by one or more solderable nuts 522 having an internally threaded aperture extending therethrough. The solderable nuts may be soldered into preformed holes 524 in the printed circuit board or, alternatively, surface soldered to the printed circuit board as previously described. The solderable nuts are aligned with preformed holes 526 in the heat sink and secured by a screw 520 or the like. Alternatively, solderable studs or any other suitable means may be used to mount the heat sink on the printed circuit board. Such solderable studs or solderable nuts could, of course, be molded into the body 528 in the position of hole 530 as shown in FIG. 14.

Figure 15:
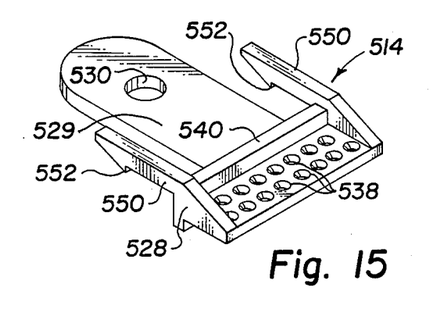
FIG. 15 is a top pictorial view of the alignment apparatus of FIG. 13.
Figure 16:
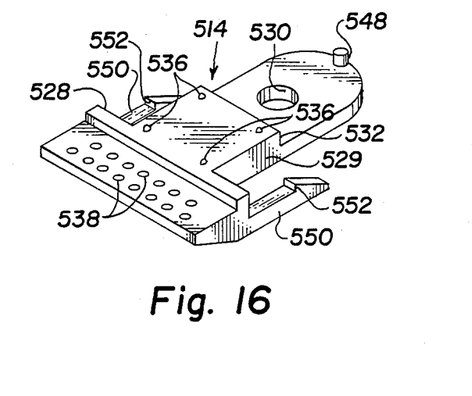
FIG. 16 is a bottom pictorial view of the alignment apparatus of FIG. 15.

Alignment apparatus 514 is shown in greater detail in the pictorial views of FIGS. 15 and 16. The alignment apparatus includes a body 528 constructed as previously described. The body includes a longitudinal section 529 having holes 530 for alignment with one or more solderable nuts 522 and a like number of holes 526 in the heat sink. Shoulder 532 is formed in the body to accommodate stand-off portion 534 of the solderable nut. The body may include a plurality of protuberances 536 on its underside for spacing the body from the surface of the printed circuit board and includes a plurality of preformed pin holes 538 extending through the body in two parallel rows for receiving the pin connectors of the electronic component, retaining them in a predetermined relationship and aligning them with the printed circuit board. Transverse shoulder 540 is formed and adapted to register against an edge of the heat sink to position the body of the alignment apparatus with respect thereto.

Means are also provided to releasably connect the body to the heat sink. In the embodiment illustrated in FIGS. 13-16, the connection means includes a spaced pair of resilient fingers 550, each terminating in stud 552. The fingers straddle the longitudinal section and are adapted to engage aligned holes 556 in the heat sink. The heat sink may be released from the alignment device, if desired, by deflecting the fingers and extracting the studs from the holes. Stud 548 is formed on longitudinal section 529 to assist in supporting the heat sink and electronic component. Of course, one or more fingers may be employed as part of the connection means with a like number of aligned holes formed in the heat sink.

Figure 17:
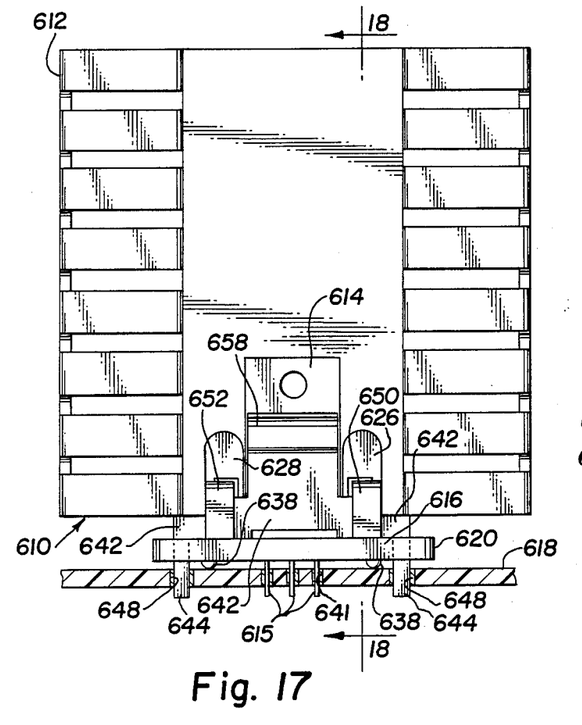
FIG. 17 is a front elevational view of a heat sink, electronic component and alignment apparatus constructed in accordance with still another embodiment of the invention and located on a printed circuit board.
Figure 18:
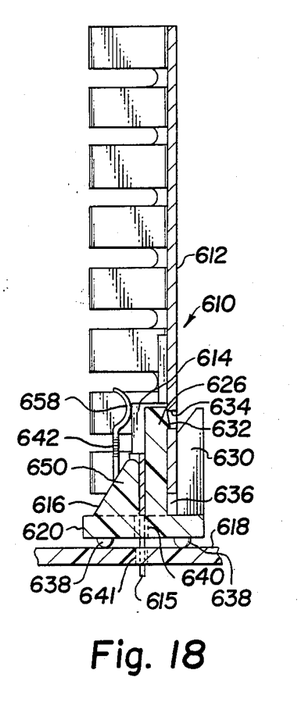
FIG. 18 is a cross-sectional view taken generally along line 18-18 of FIG. 17.
Figure 19:
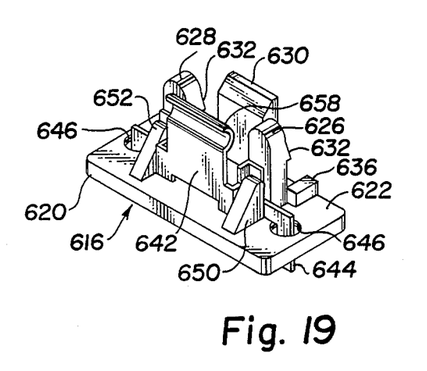
FIG. 19 is a top pictorial view of the alignment apparatus of FIG. 17.
Figure 20:
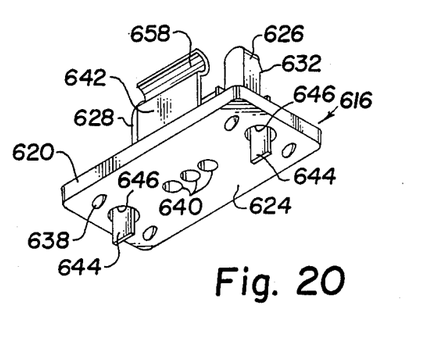
FIG. 20 is a bottom pictorial view of the alignment apparatus of FIG. 17.

Referring now to FIGS. 17 and 18, shown therein and generally designated by the reference character 610 is a subassembly consisting of a heat sink 612, an electronic component 614 and yet another alternate embodiment of the alignment apparatus 616 (shown in detail in FIGS. 19 and 20); and a printed circuit board 618. In the illustrated embodiment of the invention, the electronic component takes the form of a transistor having three downwardly extending pin connectors 615. Alignment apparatus 616 includes a body 620 (also shown in detail in FIGS. 21 and 22) defining top surface 622 and bottom surface 624 and is formed from electrically insulating material as previously described.

Means are formed on the body for releasably connecting the heat sink to the alignment apparatus which, in the illustrated embodiment, includes three upwardly projecting spaced tabs 626, 628 and 630. The tabs are located in an alternating arrangement to receive the heat sink between tabs 626 and 628 on one side and tab 630 which is located on the other side thereof.

Studs 632 are formed on tabs 626 and 628. Aligned holes 634 are formed in the heat sink. As the heat sink is inserted between tabs 626, 628 and 630, the studs are encountered and tabs 626 and 628 are slightly deflected outwardly until holes 634 (shown in FIG. 18) are reached. The studs then spring forward to engage the hole and secure the heat sink with the body. The heat sink may be released by deflecting tabs 626 and 628 outwardly to remove the studs from the holes in the heat sink.

On the top surface of the body are formed one or more spacing elements 636 for contacting the lower edge of the heat sink when inserted between the tabs to accurately position the heat sink with respect to the top surface of the body. On the bottom surface the body is provided with one or more protuberances 638 to maintain the body a predetermined distance above the surface of the printed circuit board when mounted thereon. The body also includes a suitable number of pin connector holes 640 extending from the top surface to the bottom surface.

Figure 23:
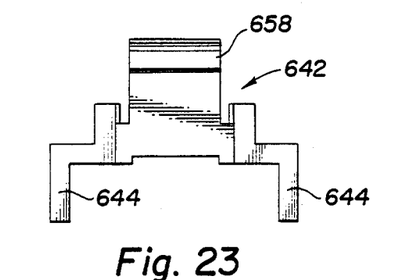
FIG. 23 is a front view of the attachment member of FIG. 17.
Figure 24:
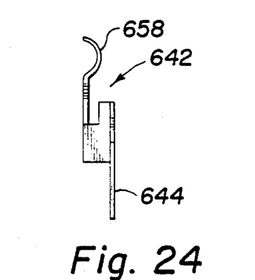
FIG. 24 is a side view of the attachment member of FIG. 17.

Means are provided to secure the electronic component to the heat sink in good thermal contact therewith and to attach the alignment apparatus and heat sink to the printed circuit board. The attachment and securing means includes attachment member 642 (shown in greater detail in FIGS. 23 and 24). The attachment member 642 is preferably a unitary body formed from resilient metallic material. A pair of mounting tabs 644 extend laterally and downwardly from either side of the attachment member and each includes a portion located in an aligned aperture 646 in the body. The lower ends of the mounting tabs are adapted for mounting on preformed locations on the printed circuit board. As shown in FIGS. 23 and 24 the lower ends of the mounting tabs are adapted for insertion and soldering into aligned preformed holes 648 in the printed circuit board Preferably, the mounting tabs are at least partially coated with a solder-promoting material.

Support members 650 and 652 project upwardly from the top surface of the body and are aligned with and spaced from tab members 626 and 628, respectively. Attachment member 642 is held in place and supported on the body when interposed between the support members and the tabs.

Figure 23A:
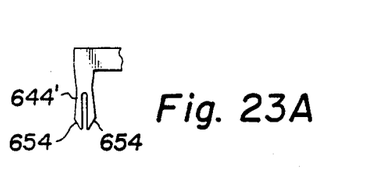
FIG. 23A is a detailed front view of an alternate embodiment of one of the mounting tabs of the attachment member of FIG. 23.

FIG. 23A illustrates an alternative embodiment of the mounting tabs in which ends 644 of the mounting tabs are inserted into preformed holes in the printed circuit board. Each of the mounting tabs includes two fingers 654 which frictionally engage the walls of the holes in the printed circuit board. The fingers secure the attachment member to the printed circuit board until the mounting tabs are permanently soldered in place.

Figure 24A:
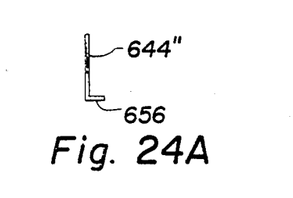
FIG. 24A a detailed cross-sectional view of another alternate embodiment of one of the mounting tabs of the attachment member of FIG. 24.

Another alternative embodiment is shown in FIG. 24A wherein the mounting tabs are adapted for attachment to he surface of the printed circuit board by soldering. The ends of the mounting tabs 644″ include a surface 656 disposed parallel with the surface of the printed circuit board and adapted for soldering to preformed mounting pads or areas on the printed circuit board. The surface 656 may be formed, for instance, by inserting the mounting tabs through the preformed holes in the body and then bending the lowermost ends of the tabs approximately 90°.

The attachment member also includes upwardly extending clip 658. The clip is positioned on the attachment member for contact with the electronic component after the alignment apparatus is connected to the heat sink. The electronic component is inserted between the heat sink and the clip with the pin connectors 615 of the electronic component extending through the preformed holes 640 in the body 620 and into the preformed holes 641 in the printed circuit board. The clip acts to urge the electronic component into intimate thermal contact with the heat sink and to secure the electronic component in the desired position when mounted on the printed circuit board, obviating the need for a rivet or screw as in FIGS. 1 and 2. Thus, the attachment member combines the solderable attachment means and the securing means into a unitary structure. Alternatively, the clip portion of the attachment member may be omitted, if desired, and the electronic component secured to the heat sink in a conventional manner.

Figure 25:
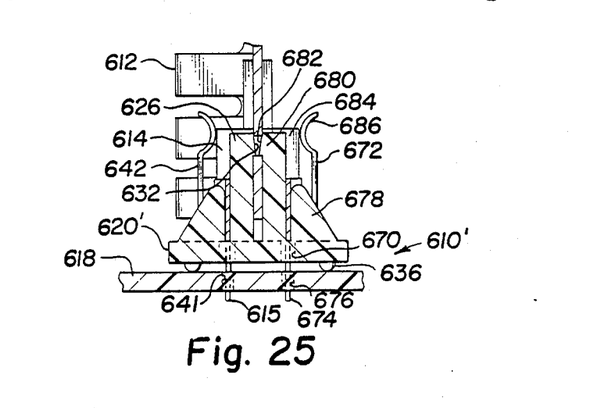
FIG. 25 is a side view partially in cross-section of another embodiment of the alignment apparatus of FIG. 17 also constructed in accordance with the invention.

FIG. 25 illustrates an alternate embodiment 610′ of the embodiment shown in FIGS. 17 and 18. It is frequently advantageous to connect two or more electronic components to the same heat sink to conserve surface space on the printed circuit board and to reduce material and manufacturing costs. In FIG. 25, the body 620′ of the alignment apparatus extends beyond both sides of the heat sink. A second pair of spaced apertures (not shown) are formed on the body separated from the first pair of apertures 646 by the heat sink. A second attachment member 672 substantially identical to attachment member 642 is located on the opposite side of the heat sink with a pair of laterally and downwardly extending mounting tabs (not shown) extending through aligned apertures (not shown) in the body. Alternatively, the attachment member may be formed with a unitary U-shaped body (not shown) having two opposing upwardly extending clips and with a pair of laterally and downwardly extending mounting tabs (as in the embodiment in FIG. 17) in place of the two separate attachment members shown in FIG. 25. The mounting tabs are each mounted on preformed locations on the printed circuit board.

Figure 21:
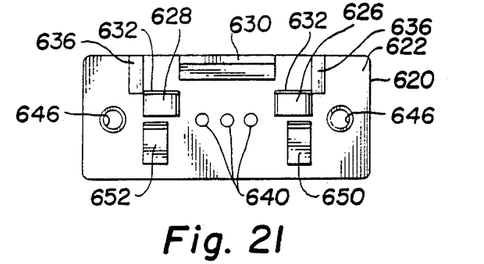
FIG. 21 is a top view of the body of the alignment apparatus of FIG. 17.
Figure 22:
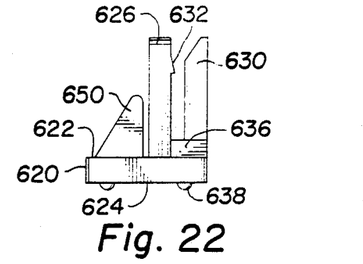
FIG. 22 is a side view of the body of the alignment apparatus of FIG. 17.

Clip support members 678 (only one of which is shown in FIG. 25) support attachment member 672 and secure it in place on the body. A second pair of tabs 680 (only one of which is shown in FIG. 25) extends upwardly from the top surface of the body. The tabs 680 are each aligned with one of tabs 626 and 628 and define a slot therebetween for receiving the heat sink. In this embodiment intermediate tab 630, as in FIGS. 21 and 22, is omitted. Studs 682 are formed on the tabs 680 and are adapted for engagement with aligned holes 634 in the heat sink. A second electronic component 684 is secured to the opposite side of the heat sink by the clip 686 on the second attachment member 672 with the pin connectors 674 from the electronic component extending through aligned holes 670 in the body into aligned preformed holes 676 in the printed circuit board. In all other respects the alignment and securing device functions are as hereinabove described.

Figure 26:
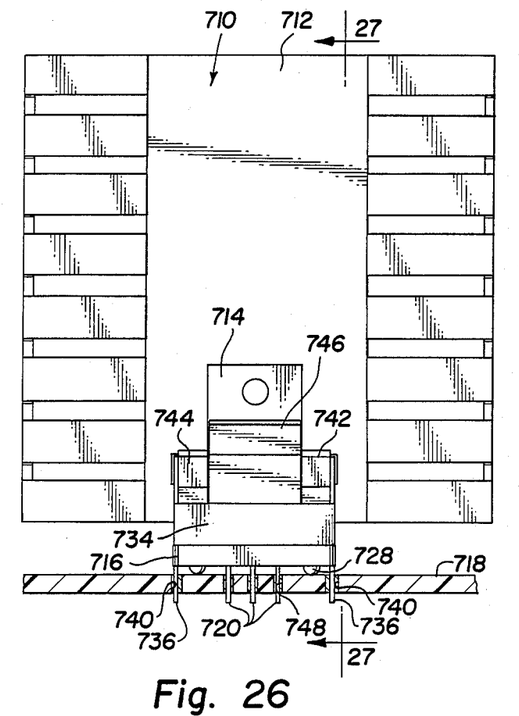
FIG. 26 is a front elevational view of a heat sink, electronic component and alignment apparatus constructed in accordance with still another alternate embodiment of the invention and located on a printed circuit board.
Figure 27:
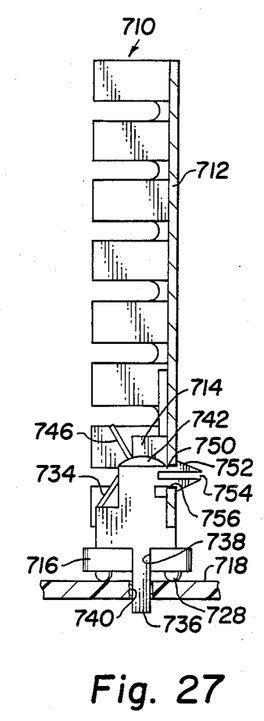
FIG. 27 is a cross-sectional view taken generally along line 27-27 of FIG. 26.
Figure 28:
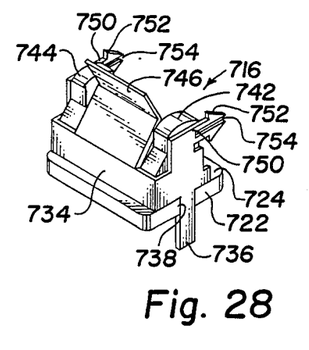
FIG. 28 is a top pictorial view of the alignment apparatus of FIG. 26.
Figure 29:
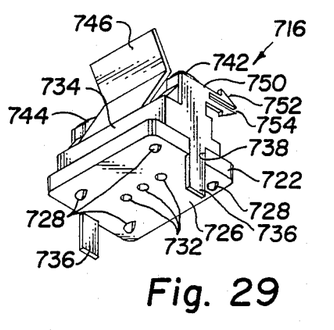
FIG. 29 is a bottom pictorial view of the alignment apparatus of FIG. 28.

Referring now to FIGS. 26 and 27, shown therein and generally designated by the reference character 710 is a subassembly consisting of a heat sink 712, an electronic device package 714 and another alternate embodiment of the alignment apparatus 716 (shown in detail in FIGS. 28 and 29); and a printed circuit board 718. In the illustrated embodiment of the invention, the electronic component takes the form of a transistor having three downwardly extending pin connectors 720. Alignment apparatus 716 includes a body 722 defining top surface 724 and bottom surface 726 and is formed of electrically insulating material as previously described. On the bottom surface 726 the body is provided with one or more protuberances 728 to maintain the body a predetermined distance above the surface of the printed circuit board when mounted thereon. The body also includes a suitable number of pin connector holes 732 extending from the top surface to the bottom surface.

Means are provided to secure the electronic component to the heat sink in good thermal contact therewith and to attach the alignment apparatus and heat sink to the printed circuit board. The attachment and securing means includes attachment member 734. The attachment member 734 is preferably a unitary body formed from resilient metallic material. A pair of mounting tabs 736 extend laterally and downwardly from either side of the attachment member and each includes a portion located in a slot 738 in either end of the body. The lower ends of the mounting tabs are adapted for mounting with the printed circuit board. As shown in FIGS. 26 and 27 the lower ends of the mounting tabs are adapted for insertion and soldering into aligned preformed holes 740 in the printed circuit board. Preferably, the mounting tabs are at least partially coated with a solder-promoting coating.

Support members 742 and 744 project upwardly from the top surface of the body. Attachment member 734 is held in place and supported on the body when interposed about the support members with the mounting tabs inserted in the slots as shown.

The attachment member also includes upwardly extending clip 746. The clip is positioned on the attachment member for contact with the electronic component after the alignment apparatus is connected to the heat sink. The electronic component is inserted between the heat sink and the clip with the pin connectors 720 of the electronic component extending through the preformed holes 732 in the body 722 and into the preformed holes 748 in the printed circuit board for connection by soldering. Alternatively, the connector pins and the mounting tabs may be surface soldered to the printed circuit board as previously described. The clip acts to resiliently urge the electronic component into intimate thermal contact with the heat sink and to secure the electronic component in the desired position when mounted on the printed circuit board, obviating the need for a rivet or screw as in FIGS. 1 and 2.

Means are provided to releasably connect the alignment device to the heat sink. In the embodiment of FIGS. 26-29 the connection means takes the form of a pair of laterally spaced arms 750 integrally formed on attachment member 734. Each arm includes a triangular head portion 752 divided by a slot 754. As the heat sink is brought adjacent the alignment device, the arms are inserted through aligned holes 756 in the heat sink. As the arms pass through the holes, the head portions are compressed across slots 754 but the head portions resiliently return to a relaxed state (as shown in FIG. 27) locking the heat sink and alignment apparatus together with the electronic component secured to the heat sink by clip 746. The heat sink may be detached by manually compressing the head portions and withdrawing the arms from the holes in the heat sink. If desired, one, two or more arms as hereinabove described may be employed as part of the connection means with a like number of aligned holes formed in the heat sink.

Although the invention has been described with particular reference to preferred embodiments thereof, these are advanced for illustrative purposes only and are not intended to limit the scope of the invention. For instance, it is within the scope of this invention that the pin connectors of an electronic component or the solderable attachment means may either be soldered into preformed holes in the printed circuit board or surface soldered onto preformed mounting pads on the printed circuit board, both of which are encompassed by the term "mounting on a preformed location on the printed circuit board" as discussed herein. Accordingly, while the invention has been described with reference to specific embodiments thereof, it is to be understood that the forms of the invention shown and described in detail are to be taken as preferred embodiments thereof, and that various changes and modifications may be resorted to without departing from the spirit and scope of the invention as defined by the appended claims.

What is claimed:

1. Alignment apparatus for use in connection with a printed circuit board, a heat sink and an electronic component package having pin connectors comprising:
    (a) an electrically insulating body having a plurality of holes extending through said body for receiving, aligning and retaining the pin connectors of an electronic component package in predetermined relationship;

(b) connection means for releasably connecting said body to a heat sink; and
(c) solderable attachment and securing means for attaching said body to a printed circuit board, said attachment and securing means located in said body and retained therein in predetermined relationship to said holes and for securing said electronic component package to and in thermal contact with said heat sink.

2. Alignment apparatus as defined in claim 1 wherein said solderable attachment and securing means includes an attachment member having at least one solderable mounting tab extending through said body for mounting on said printed circuit board.

3. Alignment apparatus as defined in claim 2 wherein said connection means comprises at least one arm formed on said attachment member and adapted for insertion into an aligned hole in said heat sink to releasably connect said heat sink to said alignment apparatus.

4. Alignment apparatus as defined in claim 2 wherein said attachment member further comprises a unitary body having a resilient clip adapted for contact with said electronic component package to secure said electronic component package to said heat sink.

5. Alignment apparatus as defined in claim 2 wherein said body includes support means extending therefrom for releasably connecting said attachment member to said body and wherein said at least one mounting tab of said attachment member is located in an aperture in said body.

6. Alignment apparatus as defined in claim 1 wherein said attachment and securing means is molded into said body.

7. Alignment apparatus as defined in claim 1 wherein:
(a) said body includes a top surface and a bottom surface through which said holes extend; and
(b) said connection means includes spaced tab means projecting upwardly from said top surface for releasably connecting said body to said heat sink.

8. Alignment apparatus as defined in claim 7 wherein said tab means includes three tab members projecting from said top surface and located in alternate positions defining a space therebetween for receiving said heat sink.

9. Alignment apparatus as defined in claim 8 wherein one of said tab members has a stud projecting therefrom for insertion into an aligned hole in said heat sink.

10. Alignment apparatus as defined in claim 7 wherein said solderable attachment and securing means includes an attachment member having at least one solderable mounting tab extending through said body for mounting on said printed circuit board.

11. Alignment apparatus as defined in claim 10 wherein said body includes support means extending therefrom for releasably connecting said attachment member to said body and wherein said at least one mounting tab of said attachment member is located in an aperture in said body.

12. Alignment apparatus as defined in claim 1 wherein said solderable attachment and securing means includes at least one surface having a solder-promoting coating and which is adapted to be disposed parallel with the surface of said printed circuit board when said body is adjacent thereto for mounting the solderable attachment and securing means and said body on a preformed location on the surface of said printed circuit board.

13. Alignment apparatus as defined in claim 1 wherein said solderable attachment and securing means includes at least one portion which has a solder-promoting coating and which is adapted for insertion into a preformed hole in said printed circuit board and soldering therewithin to mount said solderable attachment and securing means and said body on a preformed location on said printed circuit board.

14. Alignment apparatus for use in connection with a printed circuit board, a heat sink and an electronic component package having pin connectors comprising:
(a) an electrically insulating body having a plurality of holes extending through said body for receiving, aligning and retaining the pin connectors of an electronic component package in predetermined relationship;
(b) connection means for releasably connecting said body to a heat sink; and
(c) an attachment and securing member for attaching said body to a printed circuit board, said attachment and securing member having a pair of laterally and downwardly extending mounting tabs, each of said mounting tabs located in an aperture in said body and adapted for soldering to said printed circuit board for mounting said body and said heat sink thereon, said attachment and securing member further including a resilient clip projecting therefrom and adapted for securing said electronic component package to said heat sink.

15. Alignment apparatus as defined in claim 14 wherein said mounting tabs of said attachment and securing member include a surface having a solder-promoting coating and which is adapted to be disposed parallel with the surface of said printed circuit board when said body is adjacent thereto for mounting said attachment and securing member and said body on a preformed location on the surface of said printed circuit board.

16. Alignment apparatus as defined in claim 14 wherein said mounting tabs of said attachment and securing member include a portion which has a solder-promoting coating and which is adapted for insertion into a preformed hole in said printed circuit board and soldering therewithin to mount said attachment and securing member and said body on a preformed location on said printed circuit board.

17. Alignment apparatus for use in connection with a printed circuit board, a heat sink and an electronic component package having pin connectors comprising:
(a) an electrically insulating body having a plurality of holes extending therethrough for receiving, aligning and retaining the pin connectors of an electronic component package in predetermined relationship, said body adapted for mounting on a printed circuit board with a heat sink and said electronic component package to accurately position the pin connectors with respect to said printed circuit board;
(b) connection means for releasably connecting said body to said heat sink and
(c) solderable attachment means for attaching said body to said printed circuit board, said solderable attachment means retained on said body in predetermined relationship to said holes and including an attachment member having at least one solderable mounting tab extending through said body for mounting on said printed circuit board.

18. Alignment apparatus for use in connection with a printed circuit board, a heat sink and an electronic component package having pin connectors comprising:
(a) an electrically insulating body having a plurality of holes extending therethrough for receiving, aligning and retaining the pin connectors of an electronic component package in predetermined relationship, said body adapted for mounting on a printed circuit board with a heat sink and said electronic component package to accurately position the pin connectors with respect to said printed circuit board;
(b) connection means for releasably connecting said body to said heat sink; and
(c) solderable attachment means for attaching said body to said printed circuit board, said solderable attachment means retained on said body in predetermined relationship to said holes and including securing means adapted for securing the electronic component package to said heat sink with the pin connectors extending through said holes.

19. Alignment apparatus as defined in claim 18 wherein said securing means comprises a clip adapted for resiliently urging the electronic component package into thermal contact with said heat sink.

20. Alignment apparatus for use in connection with a printed circuit board, a heat sink and an electronic component package having pin connectors comprising:
(a) an electrically insulating body having a plurality of holes extending therethrough for receiving, aligning and retaining the pin connectors of an electronic component package in predetermined relationship, said body adapted for mounting on a printed circuit board with a heat sink and said electronic component package to accurately position the pin connectors with respect to said printed circuit board; and
(b) connection means for releasably connecting said body to said heat sink comprising at least one arm extending from said body adapted to engage an aligned hole in said heat sink when adjacent said body to releasably connect said heat sink to said body.

21. Alignment apparatus for use in connection with a printed circuit board, a heat sink and an electronic component package having pin connectors comprising:
(a) an electrically insulating body having a plurality of holes extending therethrough for receiving, aligning and retaining the pin connectors of an electronic component package in predetermined relationship, said body adapted for mounting on a printed circuit board with a heat sink and said electronic component package to accurately position the pin connectors with respect to said printed circuit board;
(b) connection means for releasably connecting said body to said heat sink; and
(c) solderable attachment means for attaching said body to said printed circuit board, said solderable attachment means retained on said body in predetermined relationship to said holes and further comprising connection means for releasably connecting said body to said heat sink.

22. Alignment apparatus for use in connection with a printed circuit board, a heat sink and an electronic component package having pin connectors comprising:
(a) an electrically insulating body having a plurality of holes extending therethrough for receiving, aligning and retaining the pin connectors of an electronic component package in predetermined relationship, said body adapted for mounting on a printed circuit board with a heat sink and said electronic component package to accurately position the pin connectors with respect to said printed circuit board;
(b) connection means for releasably connecting said body to said heat sink; and
(c) solderable attachment means for attaching said body to said printed circuit board, said solderable attachment means retained on said body in predetermined relationship to said holes and including at least one surface which has a solder-promoting coating and which is adapted to be disposed parallel with the surface of said printed circuit board when said body is adjacent thereto for mounting said solderable attachment means and said body on a preformed location on the surface of said printed circuit board.

23. Alignment apparatus for use in connection with a printed circuit board, a heat sink and an electronic component package having pin connectors comprising:
(a) an electrically insulating body having:
(i) first and second ends;
(ii) slots located in each end for removably receiving solderable attachment means;
(iii) connection means for releasably connecting said body to a heat sink; and
(iv) a plurality of holes extending through said body for receiving, aligning and retaining the pin connectors of an electronic component package in predetermined relationship; and
(b) solderable attachment means for attaching said body to a circuit board, said attachment means located in said body and retained therein in predetermined relationship to said holes.

24. Alignment apparatus for use in connection with a printed circuit board, a heat sink and an electronic component package having pin connectors comprising:
(a) an electrically insulating body having:
(i) top and bottom surfaces;
(ii) connection means for releasably connecting said body to a heat sink, said connection means including spaced tab means projecting upwardly from said top surface for releasably connecting said body to said heat sink; and
(iii) a plurality of holes extending through said top and bottom surfaces of said body for receiving, aligning and retaining the pin connectors of an electronic component package in predetermined relationship;
(b) solderable attachment means for attaching said body to a circuit board, said attachment means located in said body and retained therein in predetermined relationship to said holes; wherein
(c) said tab means includes a pair of tab members with one of said tab members arranged to engage said electronic component package and the other arranged to engage said heat sink;
(d) said one tab member has a ledge projecting toward said other tab member for engaging a top surface on said electronic component package; and
(e) said other tab member includes a stud projecting toward said one tab member for insertion into a hole in said heat sink.

25. Alignment apparatus for use in connection with a printed circuit board, a heat sink and an electronic component package having pin connectors comprising:
 (a) an electrically insulating body having:
  (i) first and second ends;
  (ii) slots located in each end for removably receiving solderable attachment means;
  (iii) top and bottom surfaces;
  (iv) connection means for releasably connecting said body to a heat sink, said connection means including tab means projecting upwardly from said top surface for releasably connecting said body to said heat sink; and
  (v) a plurality of holes extending through said top and bottom surfaces of said body for receiving, aligning and retaining the pin connectors of an electronic component package in predetermined relationship; and
 (b) solderable attachment means for attaching said body to a circuit board, said attachment means located in said body and retained therein in predetermined relationship to said holes; wherein
 (c) said tab means includes spaced tab members projecting from said top surface, each said tab member having a slot therein for receiving said heat sink.

26. Alignment apparatus for use in connection with a printed circuit board, a heat sink and an electronic component package having pin connectors comprising:
 (a) an electrically insulating body having:
  (i) top and bottom surfaces;
  (ii) connection means for releasably connecting said body to a heat sink, said connection means including spaced tab means projecting upwardly from said top surface for releasably connecting said body to said heat sink; and
  (iii) a plurality of holes extending through said top and bottom surfaces of said body for receiving, aligning and retaining the pin connectors of an electronic component package in predetermined relationship; and
 (b) solderable attachment means for attaching said body to a circuit board, said attachment means located in said body and retained therein in predetermined relationship to said holes; wherein
 (c) said tab means includes three tab members projecting from said top surface and located in alternate positions defining a space therebetween for receiving said heat sink.

27. Alignment apparatus as defined in claim 26 wherein the center one of said tab members has a stud located thereon projecting toward the other tab members for engaging a hole in said heat sink.

28. Alignment apparatus as defined in claim 26 wherein said body has:
 (a) first and second ends; and
 (b) slots located in each end for removably receiving said solderable attachment means.

29. Alignment apparatus as defined in claim 26 wherein:
 (a) said body has first and second ends; and
 (b) said solderable attachment means includes a solderable lug located adjacent each said end.

30. Alignment apparatus for use in connection with a printed circuit board, a heat sink and an electronic component package having pin connectors comprising:
 (a) an electrically insulating body having connection means for releasably connecting said body to a heat sink and having a plurality of holes extending through said body for receiving, aligning and retaining the pin connectors of an electronic component package in predetermined relationship; and
 (b) solderable attachment means for attaching said body to a circuit board, said attachment means located in said body and retained therein in predetermined relationship to said holes and including at least one surface having a solder-promoting coating adapted to be disposed parallel with the surface of said printed circuit board when said body is adjacent thereto for mounting said solderable attachment means and said body on a preformed location on the surface of said printed circuit board.

31. Alignment apparatus for use in connection with a printed circuit board, a heat sink and an electronic component package having pin connectors comprising:
 (a) an electrically insulating body having:
  (i) top and bottom surfaces;
  (ii) connection means for releasably connecting said body to a heat sink;
  (iii) a plurality of holes extending through said top and bottom surfaces of said body for receiving, aligning and retaining the pin connectors of an electronic component package in predetermined relationship; and
 (b) solderable attachment means for attaching said body to a circuit board, said attachment means located in said body and retained therein in predetermined relationship to said holes.

32. Alignment apparatus for use in connection with a printed circuit board, a heat sink and an electronic component package having pin connectors comprising:
 (a) an electrically insulating body having:
  (i) top and bottom surfaces;
  (ii) connection means for releasably connecting said body to a heat sink, said connection means including spaced tab means projecting upwardly from said top surface for releasably connecting said body to said heat sink; and
  (iii) a plurality of holes extending through said top and bottom surfaces of said body for receiving, aligning and retaining the pin connectors of an electronic component package in predetermined relationship; and
 (b) solderable attachment means for attaching said body to a circuit board, said attachment means located in said body and retained therein in predetermined relationship to said holes.

33. Alignment apparatus for use in connection with a printed circuit board, a heat sink and an electronic component package having pin connectors comprising:
 (a) an electrically insulating body having:
  (i) top and bottom surfaces;
  (ii) connection means for releasably connecting said body to a heat sink, said connection means including spaced tab means projecting upwardly from said top surface for releasably connecting said body to said heat sink; and
  (iii) a plurality of holes extending through said top and bottom surfaces of said body for receiving, aligning and retaining the pin connectors of an electronic component package in predetermined relationship; and
 (b) solderable attachment means for attaching said body to a circuit board, said attachment means located in said body and retained therein in predetermined relationship to said holes; wherein (c) said tab means includes tab members projecting from said top surface, each said tab member having a slot therein for receiving said heat sink.

34. Alignment apparatus for use in connection with a printed circuit board, a heat sink and an electronic component
   (a) an electrically insulating body having:
      (i) top and bottom surfaces;
      (ii) connection means for releasably connecting said body to a heat sink, said connection means including spaced tab means projecting upwardly from said top surface for releasably connecting said body to said heat sink; and
      (iii) a plurality of holes extending through said top and bottom surfaces of said body for receiving, aligning and retaining the pin connectors of an electronic component package in predetermined relationship; and
   (b) solderable attachment means for attaching said body to a circuit board, said attachment means located in said body and retained therein in predetermined relationship to said holes; wherein
   (c) said tab means includes at least two tab members projecting from said top surface and arranged on opposite sides of said holes.

35. Alignment apparatus for use in connection with a printed circuit board, a heat sink and an electronic component package having in connectors comprising:
   (a) an electrically insulating body having a plurality of holes extending therethrough for receiving, aligning and retaining the pin connectors of an electronic component package in predetermined relationship, said body adapted for mounting on a printed circuit board with a heat sink and said electronic component package to accurately position the pin connectors with respect to said printed circuit board;
   (b) connection means for releasably connecting said body to said heat sink; and
   (c) solderable attachment means for attaching said body to said printed circuit board, said solderable attachment means retained on said body in predetermined relationship to said holes and including an attachment member having at least one solderable mounting tab extending from said body for mounting on said printed circuit board.

36. Alignment apparatus for use in connection with a printed circuit board, a heat sink and an electronic component package having in connectors comprising:
   (a) an electrically insulating body having connection means for releasably connecting said body to a heat sink and having a plurality of holes extending through said body for receiving, aligning and retaining the pin connectors of an electronic component package in predetermined relationship; and
   (b) solderable mounting and alignment means for securing said body to a circuit board located in said body and retained therein in predetermined relationship to said holes.

37. Alignment apparatus as defined in claim 36 wherein:
   (a) said body has first and second ends; and
   (b) said solderable mounting and alignment means includes a solderable lug located adjacent each said end.

38. Alignment apparatus as defined in claim 37 wherein said lugs are molded into said body.

39. Alignment apparatus as defined in claim 36 wherein:
   (a) said body includes top and bottom surfaces through which said holes extend; and
   (b) said connection means includes spaced tab means projecting upwardly from said top surface for releasably connecting said body to said heat sink.

40. Alignment apparatus as defined in claim 39 wherein said tab means includes a pair of tab members with one of said tab members arranged to engage said electronic component package and the other arranged to engage said heat sink.

41. Alignment apparatus as defined in claim 39 wherein said tab means includes spaced tab members projecting from said top surface, each said tab member having a slot therein for receiving said heat sink.

42. Alignment apparatus as defined in claim 41 wherein said tab members are located adjacent first and second ends of said body.

43. Alignment apparatus as defined in claim 41 wherein:
   (a) said body has first and second ends; and
   (b) said solderable mounting and alignment means includes a solderable lug located adjacent each said end.

44. Alignment apparatus as defined in claim 36 wherein said solderable mounting and alignment means includes at least one portion having a solder-promoting coating and which is adapted for insertion into a preformed hole in the printed circuit board and soldering therewithin to mount said solderable mounting and alignment means and said body on a preformed location on the surface of said printed circuit board.

45. Alignment apparatus for use in mounting the assembly of a heat sink and an electronic component package having pin connectors on a printed circuit board comprising:
   (a) an electrically insulating body having a plurality of holes extending therethrough for receiving, aligning and retaining the pin connectors of an electronic component package in predetermined relationship, said body adapted for mounting the assembly of a heat sink and an electronic component package on a printed circuit board and for accurately positioning the pin connectors with respect to said printed circuit board;
   (b) connection means for releaseably connecting said body to said heat sink; and
   (c) solderable attachment means for attaching said body to said printed circuit board, said solderable attachment means retained on said body in predetermined relationship to said holes.

46. Alignment apparatus as defined in claim 45 wherein said solderable attachment means includes at least one portion having a solder-promoting coating which is adapted for insertion into a preformed hole in said printed circuit board and soldering therewithin to mount said solderable attachment means at a preselected location on said printed circuit board.

47. Alignment apparatus as defined in claim 45 wherein said solderable attachment means includes at least one portion having a solder-promoting coating which is adapted to mate with a preformed mounting position on the surface of said printed circuit board and soldering thereto to mount said solderable attachment means on a pre-selected position on the surface of said printed circuit board.

* * * * *

UNITED STATES PATENT AND TRADEMARK OFFICE
CERTIFICATE OF CORRECTION

PATENT NO. : 4,847,449

DATED : July 11, 1989

INVENTOR(S) : William D. Jordan, et al.

It is certified that error appears in the above-identified patent and that said Letters Patent is hereby corrected as shown below:

Column 1, line 2 of the title, "ELECTRIC" should read ---ELECTRONIC---

Column 2, line 53, "FIG. 1" should read ---FIG. 11---

Column 4, line 36, "n" should read ---an---

Column 4, line 41, "o" should read ---of---

Column 8, line 10, "board" should read ---board.---

Column 8, line 20, "644" should read ---644'---

Column 12, line 61, "sink" should read ---sink;---

Column 17, line 6, should read ---ponent package having pin connectors comprising:---

Column 17, line 28, "in" should read ---pin---

Column 17, line 49, "in" should read ---pin---

Signed and Sealed this

Twenty-second Day of May, 1990

*Attest:*

HARRY F. MANBECK, JR.

*Attesting Officer*     *Commissioner of Patents and Trademarks*